United States Patent [19]

Shikata

[11] Patent Number: 5,493,510

[45] Date of Patent: Feb. 20, 1996

[54] METHOD OF AND APPARATUS FOR PLACING BLOCKS IN SEMICONDUCTOR INTEGRATED CIRCUIT

[75] Inventor: Hiromi Shikata, Chiba, Japan

[73] Assignee: Kawasaki Steel Corporation, Hyogo, Japan

[21] Appl. No.: 148,519

[22] Filed: Nov. 8, 1993

[30]   Foreign Application Priority Data

Nov. 10, 1992 [JP] Japan ................................. 4-299671

[51] Int. Cl.$^6$ ............................................. G06F 17/50
[52] U.S. Cl. .......................... 364/491; 364/490; 364/488; 364/489
[58] Field of Search ................................. 364/488, 489, 364/490, 491, 578

[56]     References Cited

U.S. PATENT DOCUMENTS

| | | | |
|---|---|---|---|
| 4,500,963 | 2/1985 | Smith et al. | 364/300 |
| 4,593,362 | 6/1986 | Bergeron et al. | 364/488 |
| 4,613,940 | 9/1986 | Shenton et al. | 364/490 |
| 4,615,011 | 9/1986 | Linsker | 364/491 |
| 4,630,219 | 12/1986 | DiGiacomo et al. | 364/488 |
| 4,754,408 | 6/1988 | Carpenter et al. | 364/491 |
| 4,805,113 | 2/1989 | Ishii et al. | 364/491 |
| 4,858,143 | 8/1989 | Fournier | 364/491 |
| 4,908,772 | 3/1991 | Chi | 364/491 |
| 4,918,614 | 4/1990 | Modarres et al. | 364/490 |
| 5,046,017 | 9/1991 | Yuyama et al. | 364/491 |
| 5,303,161 | 4/1994 | Burns et al. | 364/490 |
| 5,309,371 | 5/1994 | Shikata et al. | 364/491 |
| 5,363,313 | 11/1994 | Lee | 364/491 |
| 5,369,596 | 11/1994 | Tokumaru | 364/491 |

FOREIGN PATENT DOCUMENTS

| | | |
|---|---|---|
| 63-153851 | 6/1988 | Japan . |
| 63-181348 | 7/1988 | Japan . |

OTHER PUBLICATIONS

H. Onodera, et al., "Step By Step Placement Strategies for Building Block Layout," *IEEE International Symposium on Circuits and Systems*, vol. 2 of 3, 1989, pp. 921–926.

K. Ueda, et al., "CHAMP: Chip Floor Plan for Hierarchical VLSI Layout Design," *IEEE Transactions on Computer–Aided Design*, vol. CAD–4, No. 1, Jan. 1985, pp. 12–22.

Y. C. Hsu, et al., "Also: A System for Chip Floorplan Design," *Integration, the VLSI Journal*, No. 2, Jul. 1988, pp. 127–146.

N. R. Quinn, et al., "A Forced Directed Component Placement Procedure for Printed Circuit Boards," *IEEE Transactions on Circuits and Systems*, vol. CAS–26, No. 6, Jun. 1979, pp. 377–388.

"Data in the Meeting for the Research of the Design Automation in the Society of Information Transaction," 18–3, Sep., 1983, pp. 1–10.

(List continued on next page.)

*Primary Examiner*—Kevin J. Teska
*Assistant Examiner*—Susan Wieland
*Attorney, Agent, or Firm*—Oliff & Berridge

[57]           ABSTRACT

A method of and an apparatus for placing blocks in a semiconductor integrated circuit determined the placement of a plurality of blocks having different sizes. An externally contacting frame is set for the plurality of blocks initially placed in such a manner as to eliminate overlapping between the blocks. The blocks are moved by compressing the externally contacting frame by a predetermined length in a first direction, and the blocks in which overlapping has consequently occurred are moved, or deformed without changing their areas. Further, the blocks are moved by compressing the externally contacting frame by a predetermined length in a second direction perpendicular to the first direction, and the blocks in which overlapping has consequently occurred are moved, or deformed without changing their areas. The compression is repeated in the two directions until a target size is obtained.

12 Claims, 7 Drawing Sheets

OTHER PUBLICATIONS

H. Onodera, et al., "A Block Placement Procedure Using a Force Model," *Papers Journal of Japan Electronics and Information Communication Society*, vol. J72–A No. 1, pp. 105–113.

"CAD System with Fully Automatic Layout of Standard Cell LSI," *Nikkei Electronics*, Jul. 28, 1986 No. 400, pp. 289–298.

G. Odawara, et al., "Partitioning and Placement Technique for CMOS Gate Arrays," *IEEE Trans. on Computer–Aided Design of Integrated Circuits and Systems*, CAD6 (1987) May, No. 3, pp. 355–363.

M. Ishikawa, et al., "Compaction Based Custom LSI Layout Design Method," *IEEE International Conference on Computer–Aided Design*, Nov. 1985, pp. 343–345.

S. Fukui, et al., "A Block Interconnection Algorithm for Hierarchical Layout System," *IEEE Transactions on Computer–Aided Design*, vol. CAD 6 No. 1, May 1987, pp. 383–390.

S. Tsukiyama, et al., "An Algorithm to Eliminate All Complex Triangles in a Maximal Planar Graph for Use in VLSI Floor–Plan," *IEEE International Symposium on Circuits and Systems*, May 5–7, 1986, pp. 321–324.

R. Tsay, et al., "Proud: A Fast Sea–Of–Gates Placement Algorithm," *25th ACM/IEEE Design Automation Conference*, Paper 22.3, pp. 318–322.

METHOD OF AND APPARATUS FOR PLACING BLOCKS IN SEMICONDUCTOR INTEGRATED CIRCUIT

BACKGROUND OF THE INVENTION

1. Field of the Invention

The present invention relates to a method of and an apparatus for placing blocks in a semiconductor integrated circuit, and more particularly to a method of and an apparatus for placing blocks in the ASICs (for example, SOG, sea of gates, Embedded Array and Standard cell) which make it possible to fully automatically design a floorplan of the ASIC by means of a computer aided design (CAD) apparatus.

2. Description of the Related Art

For one design method of the ASICs, the SOG is known as a highly integrated circuit which permits the placement and routing of cells in desired regions of a chip. In this SOG, when determining the placement and routing of cells, a hierarchical design method is adopted in which, instead of laying out small transistors from the outset, routing is first effected after functions are divided and regions are allotted in units of large macro cells, and routing of interconnections is then carried out by placing the small transistors in the large macro cells.

In this hierarchical design method, the macro cells each having a certain size and a certain shape are placed within a die of a predetermined size such that the routing length between macro cells becomes minimum. This placement presents a problem of cutting small plates out of a large plate, and the number of combinations of placement is infinite.

For this reason, the placement of macro cells and adjustment of the shape are performed manually through trial and error by using an interactive-type graphics screen of a development tool for CAD, requiring a time-consuming operation.

As an example of development tools such as the one mentioned above, for instance, Japanese Patent Unexamined Publication No. 181348/1988 discloses an apparatus for designing the layout of an LSI of a hierarchical-type layout method, comprising: a layout specification storage unit; a rough layout determining means; a rough layout information storage unit; a block layout determining means; a block layout information storage unit; a chip layout determining means; a chip layout information storage unit; and a mask pattern synthesizing means.

As an example of a very large-scale integrated circuit (VLSI) using the above-described hierarchical design method, a technique for semi-automatically designing a chip floorplan for placement of block levels, i.e., a first stage of layout, has been proposed in, for instance, the " Note of Design Automation Group, Information Processing Society of Japan, 18-3 (Sept. 1983)." In this technique, using an attractive and repulsive force method (AR method), the initial placement of blocks is first conducted by using a spring model of a mass system in which sizeless blocks are interconnected by springs. Then, in this placement, the size of each block is given in the shape of a rectangle corresponding to an actual shape, and block packing processing is effected wherein each block is moved manually through trial and error such that the overlapping of blocks is eliminated, and distant blocks are brought close to each other. In addition, in a latter half of processing, overlapping is eliminated by manually changing the aspect ratio of each block whose shape is variable. Furthermore, an area necessary for routing among blocks is calculated on the basis of information on interconnections between blocks and positional information on blocks.

Meanwhile, a block placement technique is proposed in the Transactions of the Institute of Electronics, Information and Communication Engineers of Japan, 89/1, Vol. J72-A No. 1, in which a dynamic model is set wherein there are exerted on the circuit blocks attractive force corresponding to both the number of interconnections and the distance and repulsive force corresponding to the area of overlapping. In this block placement technique, the blocks are initially placed within the die frame only by means of the attractive force due to the interconnections so as to minimize the square-sum of the routing length. Subsequently, with respect to this placement repulsive force is gradually increased with an initial value $\frac{1}{100}$ times the attractive force, and overlap is gradually eliminated by repeated calculation such that the ratio of an overlapping area to the total area of the blocks becomes 8.2% or less. Thus, the relative positional relationship of the blocks is substantially defined. Then, orientations of the blocks are examined consecutively starting with a block most distant from the center of the layout region. Finally, balanced positions of the blocks are determined, and the orientations of the blocks are rechecked to determine the layout of the blocks.

In this method, there remains slight overlapping which balances with the attractive force due to interconnections. Therefore, a modified technique has been proposed for obtaining an overlap-free layout by enlarging the blocks in advance by slight lengths prior to placement, gradually eliminating the overlap until a maximum overlapping length between the blocks becomes less than the amount of that enlargement, and finally returning the blocks to their original sizes.

In the above-described techniques, however, all the blocks are processed as rectangles and hence movement thereof are not easy. Further, in the latter technique, the aspect ratio (vertical to lateral ratio) of each block is not adjusted. Accordingly, there are cases where a compact placement is not necessarily attained as a whole particularly if variable-shape blocks, such as soft macro cells whose aspect ratio is variable, are used. Further, in the above-described techniques the positions of the blocks are moved within the die frame to eliminate overlaps among the blocks which were produced in the initial placement. Accordingly, the block positions may be moved in excess in the process of determination of the layout, with the result that the conditions of such as the total routing length being minimum and the dead space being minimum are lost.

To overcome the above-described problems, the present inventors have proposed a method of placing and routing blocks in a highly integrated circuit in U.S. patent application Ser. No. 07/543,549, now U.S. Pat. No. 5,309,371. In this method, sizeless blocks are initially placed by using a spring model of a mass system in which the blocks are interconnected by springs, the sizes of at least some blocks are given by circles, and the blocks are placed anew such that overlapping of the blocks is eliminated. Then, the outer shapes of the blocks are made compact in conformity with the die frame, the shapes of the blocks are changed from the circles to actual shapes, the blocks are expanded, regions for routing are allotted, and the aspect ratios of the blocks are adjusted. As a result, the minimization of the total routing length and the compact placement of the blocks can be effected automatically, and the aspect ratios (shapes) of the blocks can be determined automatically.

A mass-point model in which blocks are regarded as mass points and routing between blocks is regarded as attractive spring force so as to place the blocks by means of the balance of attractive force is disclosed in "PROUD; A Fast Sea-Of-Gates Placement Algorithm," 25th ACM/IEEE DAC, pp. 318–322, 1988.

However, according to the semi-automatic graphics interactive floorplans based on a manual operation or using a dynamic model only in the initial placement, which are disclosed in Japanese Patent Unexamined Publication No. 181348/1988 and in the "Note of Design Automation Group, Information Processing Society of Japan, 18-3 (Sept. 1983)," there has been a problem in that many manhours are involved in the operation.

In addition, according to the method using the dynamic model in which repulsive force is exerted on the blocks, which is disclosed in the Transactions of the Institute of Electronics, Information and Communication Engineers of Japan, 1989/1, Vol. J72-A No. 1, there has been a problem in that much processing time is required for repeated calculation for obtaining the balance of force.

Furthermore, according to the method of making blocks compact by using a dynamic model in which attractive force and repulsive force act, which is proposed in U.S. patent application Ser. No. 07/543,549 filed by the present inventors, it is necessary to take a number of processing steps in designing a floorplan, including the alteration of the shape. Hence, there has been the problem that much processing time is involved.

SUMMARY OF THE INVENTION

Accordingly, an object of the present invention is to provide a method of and an apparatus for placing blocks in a semiconductor integrated circuit which facilitate processing and permit high-speed processing, thereby overcoming the above-described problems of the conventional art.

In accordance with the present invention, the above object is attained by a method of placing blocks in a semiconductor integrated circuit for determining the placement of a plurality of blocks having different sizes, comprising the steps of: setting an externally contacting frame for the plurality of blocks initially placed in such a manner as to eliminate overlapping between the blocks; moving the blocks by compressing the externally contacting frame of the plurality of blocks by a predetermined length in a first direction, and moving the blocks in which overlapping has consequently occurred, or deforming the blocks without changing their areas; moving the blocks by compressing the externally contacting frame by a predetermined length in a second direction perpendicular to the first direction, and moving the blocks in which overlapping has consequently occurred, or deforming the blocks without changing their areas; and repeating the compression in the two directions until a target size is obtained.

Here, the blocks include macro cells. The externally contacting frame has a rectangular shape which encompasses all the blocks and externally contacts with at least one of most peripherally placed blocks. The target size corresponds to a chip size determined from circuit scale and the like in LSI design. The predetermined length for compression can be a small value of several percent (1 percent, for example) of frame length in the compressing direction.

The initial placement of the blocks can be effected by placing mass points by using a spring model of a mass system in which mass points replacing the blocks and ignoring areas of the blocks are interconnected by a spring, a block area being imparted to each of the mass points in the form of a rectangle.

When the block area is imparted to each of the mass points, a rectangle corresponding to an actual shape is imparted to the block of a hard macro cell whose shape is undeformable, while a square is imparted to the block of a soft macro cell whose shape is deformable.

In a case where the overlapping has occurred between the block of the hard macro cell whose shape is undeformable and the block of the soft macro cell whose shape is deformable, the block of the soft macro cell is deformed.

Meanwhile, in a case where the overlapping has occurred between the blocks of the soft macro cells whose shapes are deformable, both of the blocks are deformed.

Both of the aforementioned blocks are preferably deformed in accordance with a ratio of their areas.

Alternatively, both of the blocks are preferably deformed in accordance with a length in a direction of compression thereof.

A limit may be set to an amount of the deformation.

In a case where the overlapping has occurred at a plurality of portions, a total amount of overlapping is distributed to the overlapping portions in accordance with a ratio of respective amounts of overlapping, and each corresponding block is deformed by using the distributed amount of overlapping as a compression length.

Further, in a case where the overlapping has occurred at a plurality of portions, a total amount of overlapping is distributed to the overlapping portions in accordance with a ratio of the sums of areas of respective two overlapping blocks, and each corresponding block is deformed by using the distributed amount of overlapping as a compression length.

Furthermore, in a case where the overlapping has occurred at a plurality of portions, a total amount of overlapping is distributed to the overlapping portions in accordance with a ratio of sums of side lengths of respective two overlapping blocks, and each corresponding block is deformed by using the distributed amount of overlapping as a compression length.

In the present invention, when the blocks initially placed by using a spring model of a mass system, for example, are placed compactly (packed closely), instead of using a dynamic model as in a conventional manner, the blocks are first moved by compressing the externally contacting frame of the group of blocks by a predetermined length in a first direction, and the blocks in which overlapping has consequently occurred are moved, or deformed without changing their areas. Then, the blocks are moved by compressing the externally contacting frame by a predetermined length in a second direction perpendicular to the first direction, and the blocks in which overlapping has consequently occurred are moved, or deformed without changing their areas. Compression in the two directions is repeated until a target size is obtained.

In this model, the areas of the blocks are fixed, and when the blocks overlap due to the compression of the externally contacting frame, the blocks are deformed in such a manner as to remove the overlap under the assumption that the blocks are subjected to compression. As such, this model will be referred to hereinafter as a compression model.

According to this compression model, it is possible to simultaneously effect the compaction and the adjustment of the aspect ratios of the soft macro cells (alteration of the shape), processing is simplified, and high-speed processing becomes possible.

In particular, when a size (area) of the block is imparted to a mass point, if a rectangle corresponding to an actual shape is imparted to the block of a hard macro cell whose shape is undeformable, and a square is imparted to the block of a soft macro cell whose shape is deformable, it is readily possible to set the initial shapes of the hard macro cell and the soft macro cell.

In a case where the overlap has occurred between the block of the hard macro cell whose shape is undeformable and the block of the soft macro cell whose shape is deformable, if the block of the soft macro cell is deformed, it is possible to speedily effect processing in correspondence with the actual deformation permissibility of each block.

Meanwhile, in a case where the overlapping has occurred between the blocks of the soft macro cells whose shapes are deformable, if both of the blocks are deformed, the amount of deformation of each block can be made small, and the amount of compression can be absorbed easily.

If both of the aforementioned blocks are deformed in accordance with a ratio of their areas or a length in a direction of compression thereof, appropriate shape adjustment can be effected in correspondence with the deformability of each block. Namely, the smaller the area or length of the block, the less the margin for deformation.

If a limit is set to an amount of the deformation, it is possible to perform accurate shape adjustment in correspondence with the deformability of each block.

In a case where the overlapping has occurred at a plurality of portions, if a total amount of overlapping is distributed to the overlapping portions in accordance with a ratio of respective amounts of overlapping, a ratio of sums of areas of respective two overlapping blocks, or a ratio of sums of side lengths of respective two overlapping blocks, and each corresponding block is deformed by using the distributed amount of overlapping as a compression length, then it is possible to accurately effect the shape adjustment of each block in the case where overlapping has occurred at the plurality of portions.

BRIEF DESCRIPTION OF THE DRAWINGS

The above and other objects, features and advantages of the present invention will become more apparent from the following description of the invention taken in conjunction with the accompanying drawings, wherein like reference numerals designate the same or similar parts, and wherein.

DETAILED DESCRIPTION OF THE PREFERRED EMBODIMENT

Referring now to the accompanying drawings, a detailed description will be given of an embodiment of the present invention.

Figure 1:
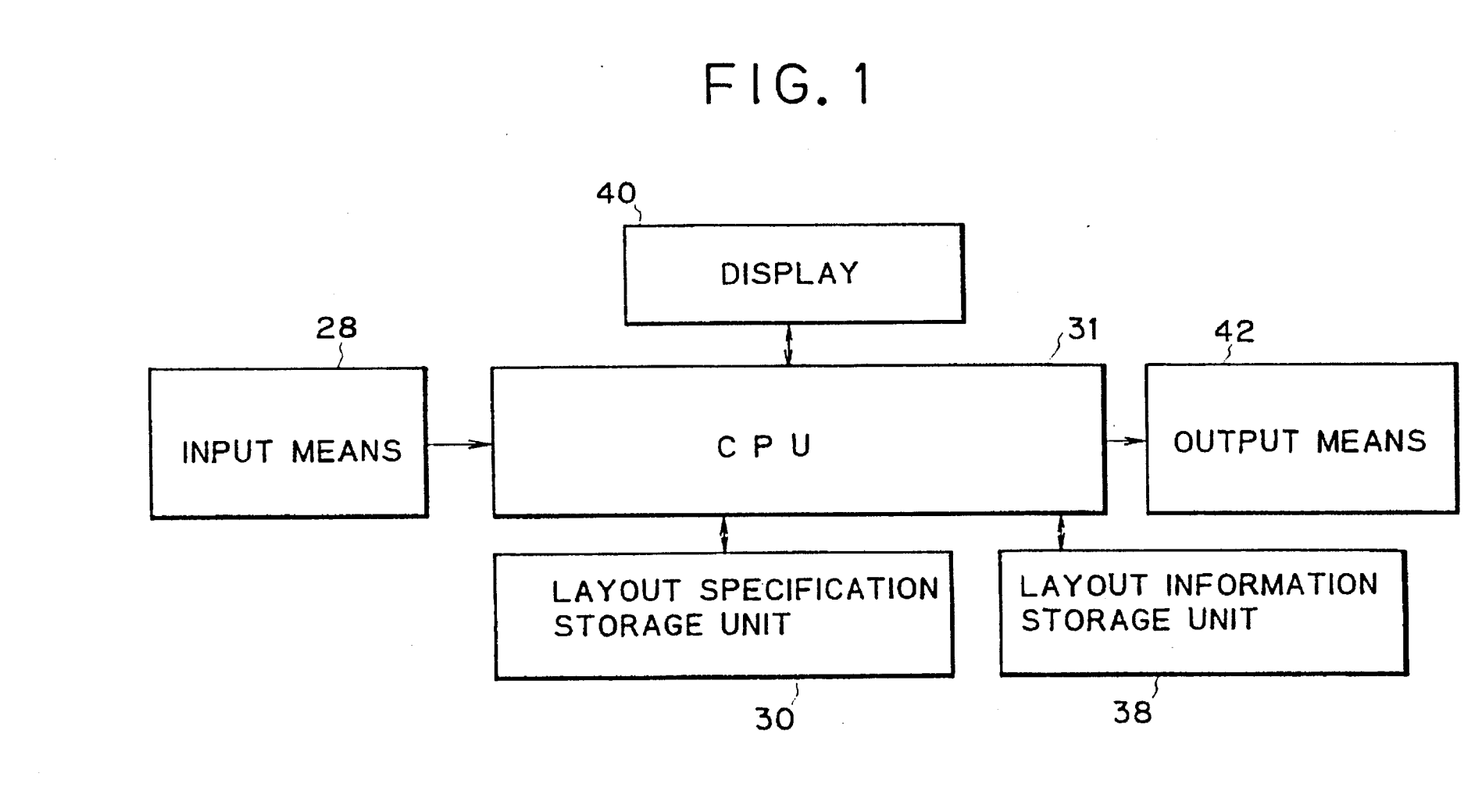
FIG. 1 is a block diagram illustrating a basic configuration of an apparatus for implementing an embodiment of a method of placing blocks in accordance with the present invention.

As shown in FIG. 1, an apparatus for placing macro cells for implementing this embodiment comprises an input means 28 for input necessary information; a layout specification storage unit 30 in which a layout specification necessary for determining the placement and routing of macro cells is stored; a central processing unit (CPU) 31 for executing processing in accordance with the present invention; a layout information storage unit 38 for storing layout information being processed by the CPU 31; a display 40 for displaying the state of processing by the CPU 31; and an output means 42 for output the layout information determined by the CPU 31.

Figure 2:
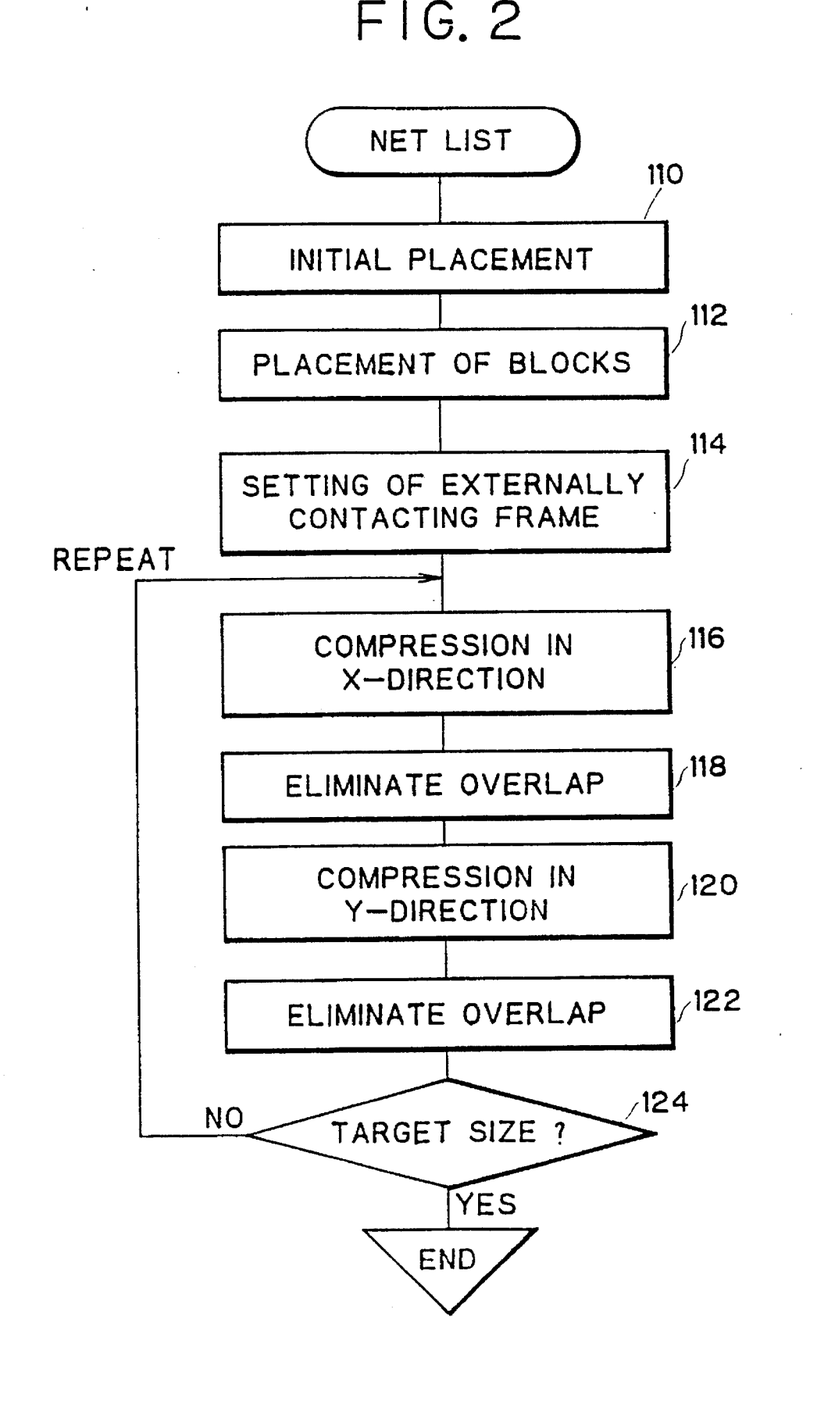
FIG. 2 is a flowchart illustrating a processing procedure in accordance with the embodiment.

Referring now to FIG. 2, a detailed description will be given of a processing procedure in accordance with the present invention.

First, in Step 110, in the same way as in a conventional example, each mass point is initially placed by using a spring model of a mass system in which each block is regarded as a mass point by ignoring its area, routing between blocks is regarded as an attracting spring, and each block is placed by the balance of attractive force.

Then, the operation proceeds to Step 112, in which, as the area of each block, a rectangle is given to each of the initially placed mass points, and sizing or normalization is performed in such a manner as to eliminate overlapping between the blocks, thereby placing rectangular blocks each having a size. At this time, a square is imparted to a soft macro cell whose shape is deformable, while a rectangle corresponding to an actual shape is imparted to a hard macro cell whose shape is undeformable.

The operation then proceeds to Step 114, in which an externally contacting frame which externally contacts a group of blocks is set.

The operation then proceeds to Step 116, in which the externally contacting frame is compressed in a first direction (e.g., in the x-direction) by a predetermined length $\Delta x$, so as to move the blocks.

The operation then proceeds to Step 118, in which the blocks which have overlapped are deformed in a state in which the block areas are fixed, so as to remove overlapping.

The operation then proceeds to Step 120, in which the externally contacting frame is compressed in a second direction (e.g., in the y-direction) perpendicular to the first direction by a predetermined length $\Delta y$, so as to move the blocks.

The operation then proceeds to Step 122, in which the blocks which have overlapped are moved or deformed without changing the block areas, so as to remove overlapping.

Figure 3:
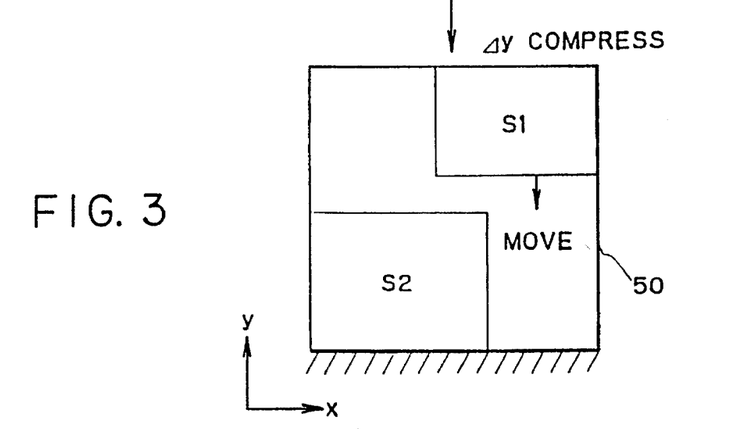
FIG. 3 is a diagram illustrating a state of movement in a case where overlapping does not occur in the embodiment.

Specifically, in the case of compression in the y-direction, if there is a gap of $\Delta y$ or more between a macro cell S1 and a macro cell S2, as shown in FIG. 3, the macro cell S1 is only moved together with an externally contacting frame 50 by $\Delta y$ in the y-direction, so that no deformation is performed.

It should be noted that although a description is given herein by citing the case of compression in the y-direction for convenience sake, it is self-evident that the same applies to the case of the x-direction as well.

Figure 4:
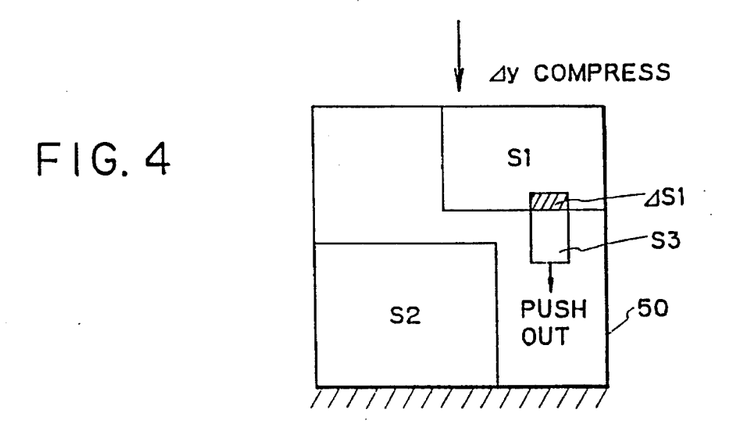
FIG. 4 is a diagram illustrating a case where overlapping occurs and a block is pushed out.
Figure 4A:
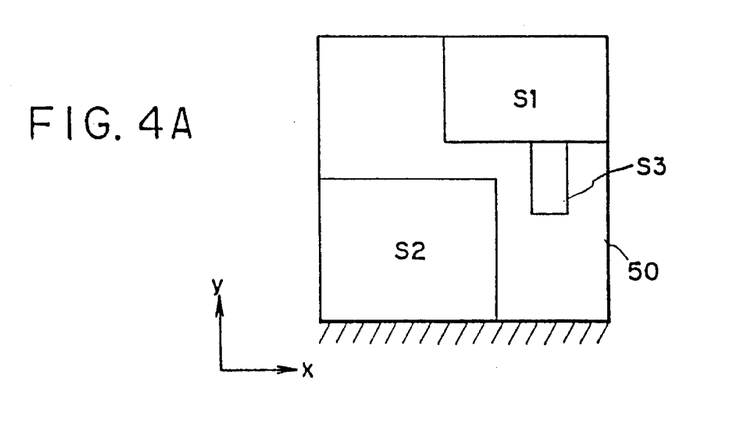

Meanwhile, in a case where an overlap $\Delta S1$ occurred between the macro cell S1 and the other macro cell S3 owing to the compression of the macro cell S1 in the y-direction, as shown in FIG. 4, since the area below the lower side of the macro cell S3 in which the overlap $\Delta S1$ occurred is a free dead space, the macro cell S3 is moved (pushed out) to the dead space until the overlap is eliminated.

Figure 5:
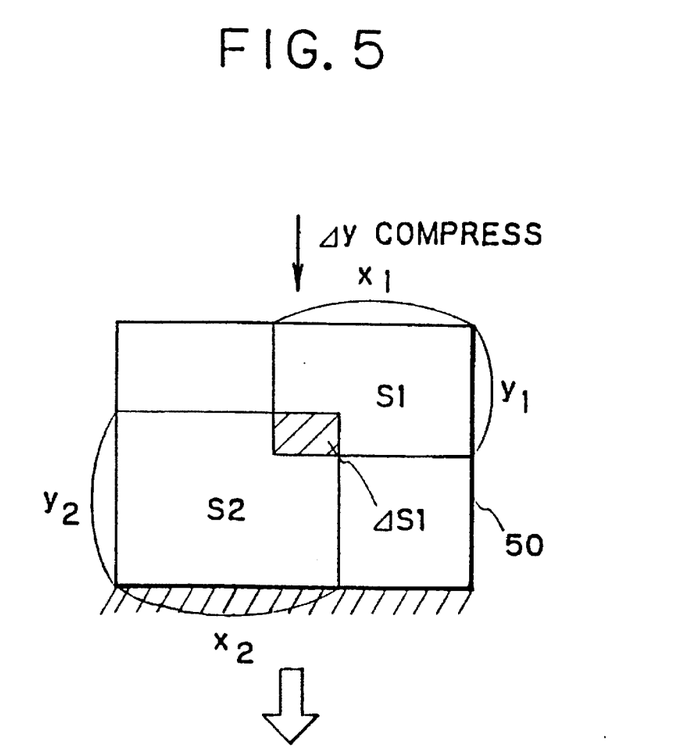
FIG. 5 is a diagram illustrating a case where overlapping occurs between a hard macro cell and a soft macro cell, and the soft macro cell is deformed.
Figure 5A:
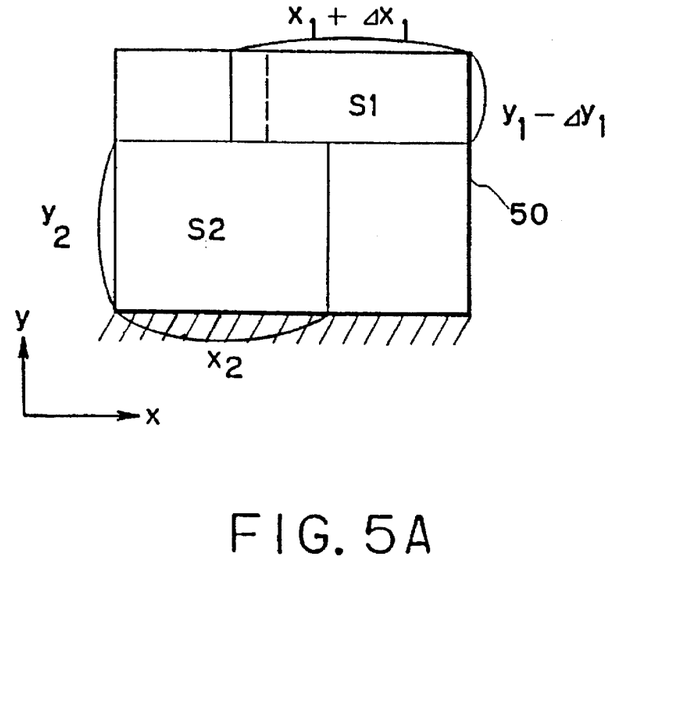

In another case where overlapping occurred and deformation is needed, and if the macro cell S1 is a soft macro cell and the macro cell S2 is a hard macro cell, as shown in FIG. 5, the hard macro cell and the soft macro cell overlap with each other. However, since the hard macro cell S2 is not deformed, only the soft macro cell S1 his deformed by being subjected to compressive force in the y-direction. Specifically, the length of the soft macro cell S1 in the y-direction is compressed from $Y_1$ to $(Y_1-\Delta Y_1)$, and its length in the x-direction is extended from $x_1$ to $(x_1+\Delta x_1)$. Here, the amount of extension in the x-direction, $\Delta x_1$, is determined in accordance with the following formula such that the area S1 of the soft macro cell S1 does not change by the deformation:

$$\Delta x_1 = \{S1/(Y_1-\Delta Y_1)\} - x_1 \qquad (1)$$

Figure 6:
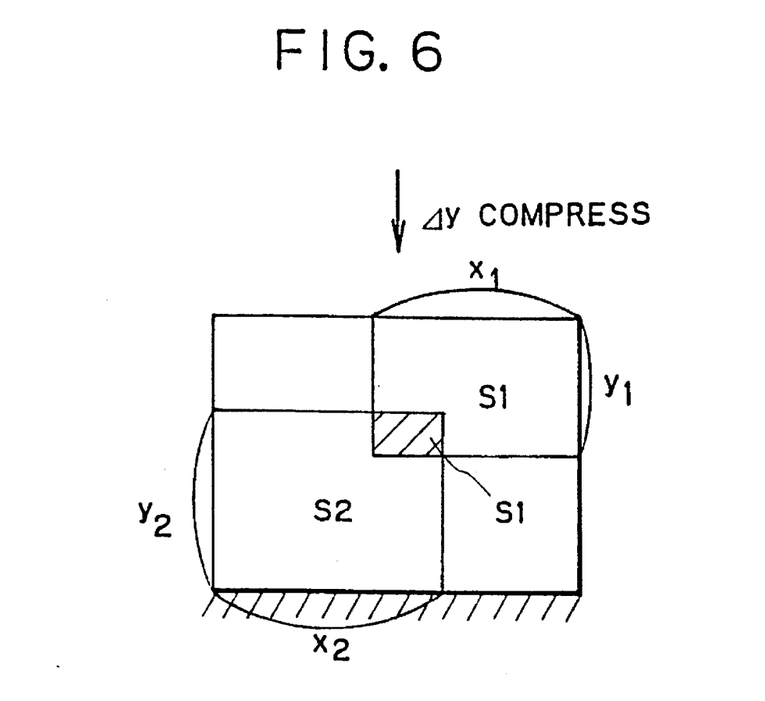
FIG. 6 is a diagram illustrating a case where overlapping similarly occurs between soft macro cells, and the soft macro cells are deformed.
Figure 6A:
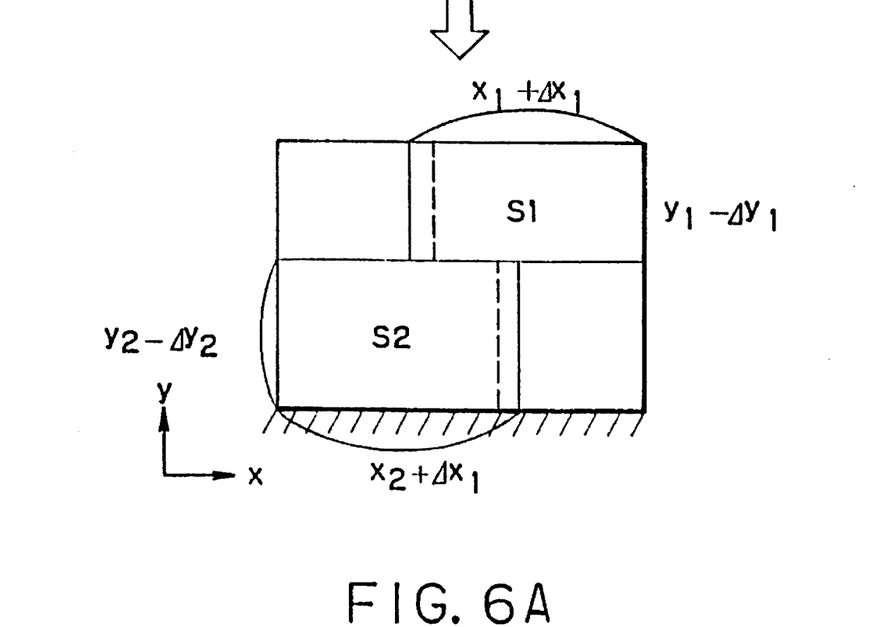

In still another case where soft macro cells overlap with each other due to compression and overlapping cannot be absorbed by mere movement, as shown in FIG. 6, both the macro cells S1 and S2 are deformed by being subjected to compressive force in the y-direction. In this case, the length of the macro cell S1 in the y-direction is compressed from $Y_1$ to $(Y_1-\Delta Y_1)$, and its length in the x-direction is extended from $x_1$ to $(x_1+\Delta x_1)$. As for the macro cell S2, its length in the y-direction is compressed from $Y_2$ to $(Y_2-\Delta y_2)$, and its length in the x-direction is extended from $x_2$ to $(x_2+\Delta x_2)$.

Here, the area $x_1 \cdot Y_1$ of the macro cell S1 prior to deformation is made equal to the area $(x_1+\Delta x_1)(Y_1-\Delta y_1)$ after deformation, while the area $x_2 \cdot Y_2$ of the macro cell S2 prior to deformation is made equal to the area $(x_2+\Delta x_2)(y_2-\Delta y_2)$ after deformation thereof.

In addition, the relation of the following formula holds between the amount of compression in the y-direction, $\Delta y$, and the amounts of compression of the macro cells in the y-direction, $\Delta Y_1$ and $\Delta Y_2$:

$$\Delta y = \Delta Y_1 + \Delta Y_2 \qquad (2)$$

Here, as the method of distributing the amounts of compression in the y-direction, $\Delta Y_1$ and $\Delta Y_2$, various methods are conceivable. For example, $\Delta Y_1$ and $\Delta Y_2$ can be distributed in correspondence with a ratio between the areas S1 and S2 of the macro cells S1 and S2, as shown by the following formulae:

$$\Delta Y_1 = \Delta y * S1/(S1+S2) \qquad (3)$$

$$\Delta Y_2 = \Delta y * S2/(S1+S2) \qquad (4)$$

In the case where an arrangement is provided such that the greater the area, the greater the amount of deformation is thus made in proportion to the area, the adjustment of shape in correspondence with the normal deformation permissibility of each macro cell is possible. The reason for this is that, in general, the smaller the area, the smaller the deformation permissibility.

The amounts of extension in the x-direction, $\Delta x_1$ and $\Delta x_2$, in this case are expressed by the following formulae:

$$\Delta x_1 = \{S1/(y_1-\Delta y_1)\} - x_1 \qquad (5)$$

$$\Delta x_2 = \{S2/(y_2-\Delta y_2)\} - x_2 \qquad (6)$$

It should be noted that the method of distribution of the amounts of deformation is not limited to that based on the ratio of area, and the macro cells may be deformed in accordance with the lengths $Y_1$ and $Y_2$ in the direction of compression (in FIG. 6, in the y-direction). In this case as well, it is considered that the greater the length of the macro cell in the direction of compression, the greater the deformation permissibility, so that adjustment of shape is effected appropriately, and calculation is more simplified than in the case where the amounts of deformation are distributed in accordance with the ratio of area. Furthermore, the amounts of deformation may be distributed uniformly to simplify the calculation.

It should be noted that it is possible to set a deformation limit (compression limit and/or expansion limit) for each macro cell in correspondence with a limit of deformation permissibility of the actual macro cell.

If such a limit is set, more accurate deformation can be obtained by taking into consideration the deformation permissibility of actual macro cells.

Figure 7A:
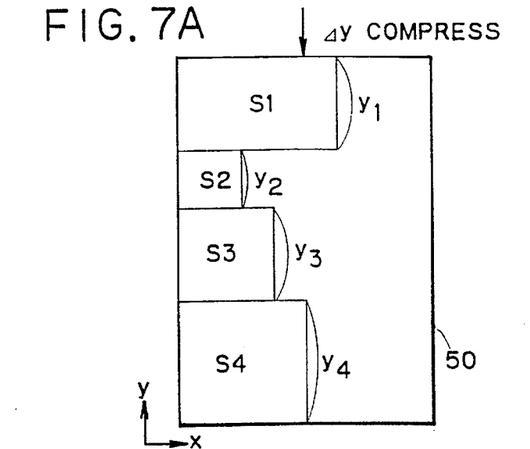
FIGS. 7A to 7E are diagrams illustrating a state in which a plurality of overlaps occur.
Figure 7B:
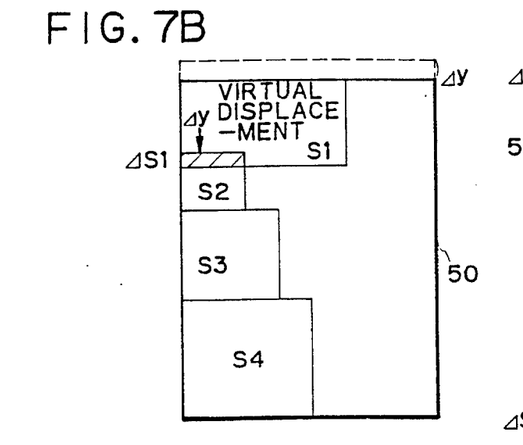
Figure 7C:
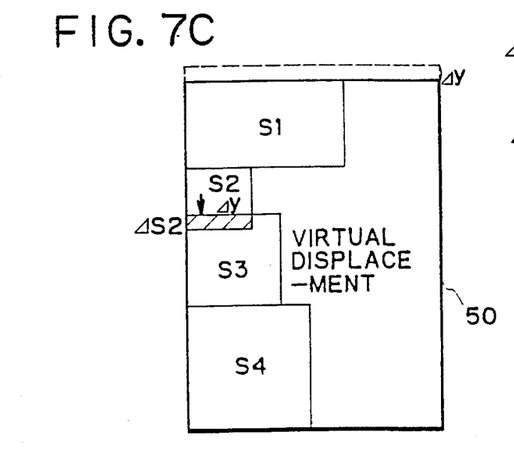
Figure 7D:
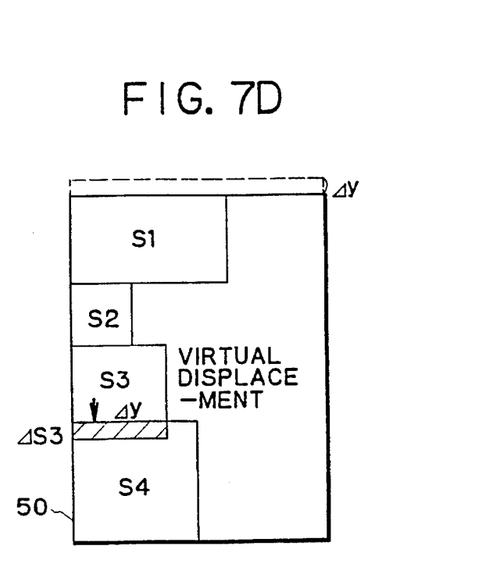
Figure 7E:
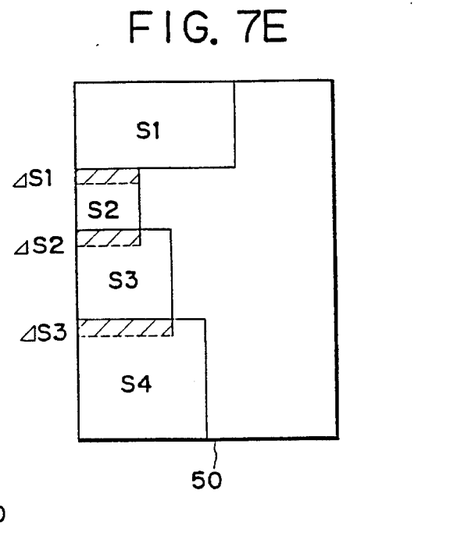

In a case where overlapping occurred at a plurality of portions in one compression, processing is effected, for example, as follows: Namely, in a case where the macro cells S1 to S4 prior to compression contacted each other as shown in FIG. 7A, the macro cell S1 is first displaced virtually by an amount $\Delta y$ by compressing the externally contacting frame 50 by the amount $\Delta y$. Then, as shown in FIG. 7B, it can be seen that the overlap $\Delta S1$ occurs between the macro cells S1 and S2. Then, the macro cell S2 is displaced virtually downwardly in the drawing by the same amount $\Delta y$ as that for the macro cell S1. Then, as shown in FIG. 7C, an overlap $\Delta S2$ occurs between the macro cells S2 and S3. Subsequently, the macro cell S3 is virtually displaced downwardly in the drawing by the same amount as that for the macro cell S2. Then, as shown in FIG. 7D, it can be seen that an overlap $\Delta S3$ occurs between the macro cells S3 and S4. In the final analysis, as shown in FIG. 7E, it can be seen that the overlaps $\Delta S1$, $\Delta S2$, and $\Delta S3$ occur between the macro cells S1 and S2, S2 and S3, and S3 and S4, respectively, owing to a series of virtual displacement.

Figure 8:
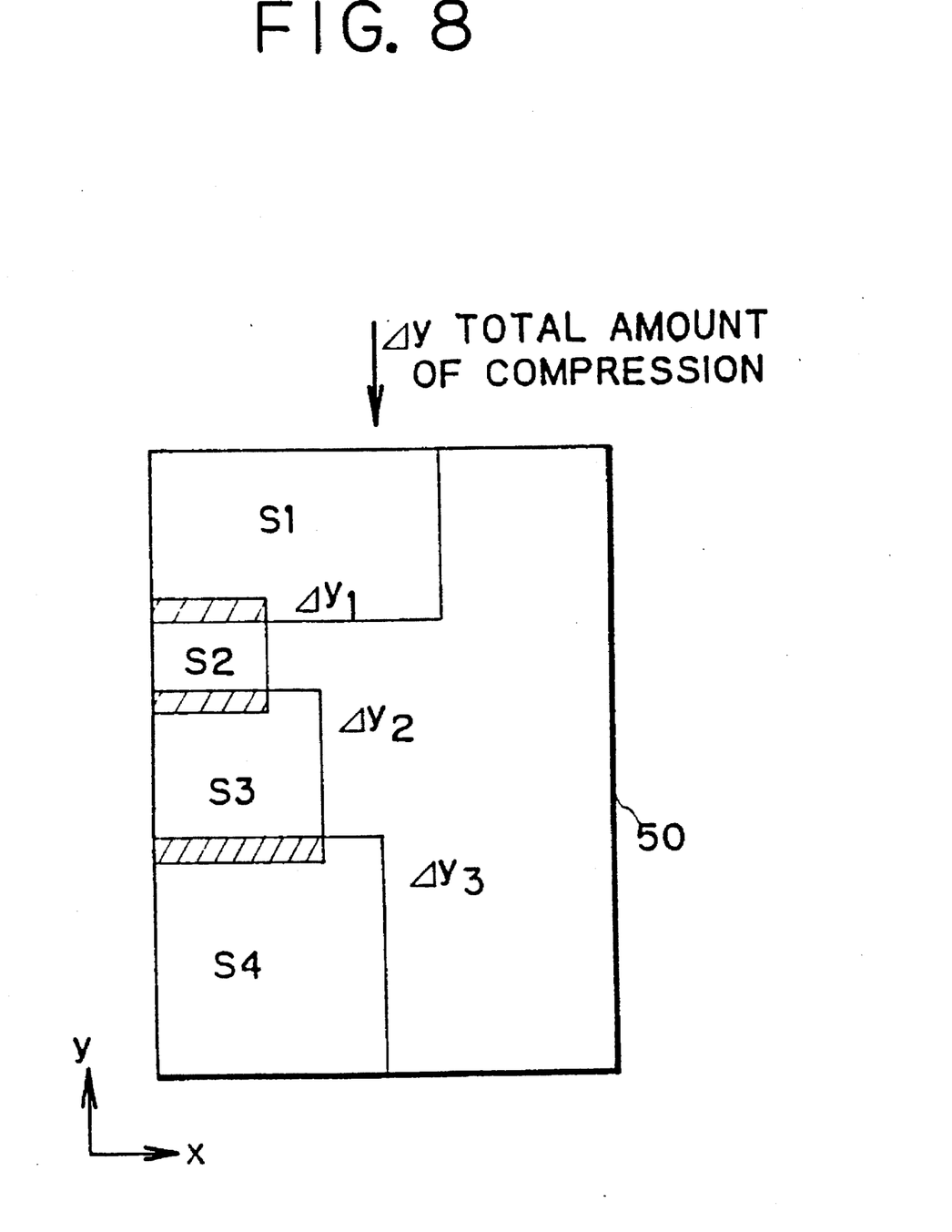
FIG. 8 is a diagram illustrating a state in which an amount of compression is distributed among respective overlaps.

Next, the total amount $\Delta y$ of compression in the y-direction is distributed among the amounts of overlapping, $\Delta Y_1$, $\Delta Y_2$ and $\Delta Y_3$, between the respective blocks in correspondence with the overlaps $\Delta S1$, $\Delta S2$, and $\Delta S3$, as shown by the following formula:

$$\Delta y = \Delta Y_1 + \Delta Y_2 + \Delta Y_3 \qquad (7)$$

The distribution of the amount of overlapping can be effected in accordance with any one of the following methods:

(1) A method based on a ratio of amounts of overlapping ($\Delta S1$, $\Delta S2$, and $\Delta S3$) in virtual displacement.

(2) A method based on a ratio of the sums of areas of respective two overlapping macro cells (S1+S2, S2+S3, and S3+S4).

(3) A method based on a ratio of the sums of side lengths of respective two overlapping macro cells ($Y_1+Y_2$, $Y_2+Y_3$, and $Y_3+Y_4$).

If the compression length with respect to each block pair is thus determined, deformation can be imparted to each macro cell in accordance with the above-described distribution of the amounts of compression between pairs.

By distributing the amount of compression in correspondence with the amount of overlapping, appropriate adjustment of shape can be effected in correspondence with the deformability of the macro cell as compared with the case where the blocks are compressed uniformly by the same amount. It goes without saying that calculation may be simplified by distributing the amount of compression uniformly to the overlapping portions.

After completion of Step 122, the operation proceeds to Step 124 to determine whether or not a target size has been obtained. If NO is given as the result of determination, the operation returns to Step 116 to repeat Steps 116 through 122.

If the target size has been obtained in Step 124, or the solution does not tend to converge even after repeated calculations, and the conditions of initialization need to be changed, this processing procedure ends.

In accordance with the present invention, since compaction can basically be effected by algebraic calculations, processing is simplified, and high-speed processing is possible. In addition, since the block is pushed in within the frame while deforming the shape of the soft macro cell, a compact placement is possible. Furthermore, the present invention offers an excellent advantage in that hard and soft macro cells can be taken into consideration at the same time

What is claimed is:

1. A method of placing blocks in a semiconductor integrated circuit for determining the placement of a plurality of blocks having different sizes, comprising the steps of:

setting an externally contacting frame for the plurality of blocks initially placed in such a manner as to eliminate overlapping between the blocks, wherein the initial placement of the blocks is by placing mass points using a spring model of a mass system in which mass points, replacing the blocks and ignoring areas of the blocks, are interconnected by a spring, a block area being imparted to each of the mass points in the form of a rectangle, when the block area is imparted to each of the mass points, a rectangle corresponding to an actual shape is imparted to the block of a hard macro cell whose shape is undeformable, while a square is imparted to the block of a soft macro cell whose shape is deformable in a first direction and a second direction perpendicular to the first direction;

moving the blocks by compressing the externally contacting frame of the plurality of blocks by a predetermined length in the first direction, and moving the blocks in which overlapping has consequently occurred, or deforming said blocks without changing their areas;

moving the blocks by compressing the externally contacting frame by a predetermined length in the second direction perpendicular to the first direction, and moving the blocks in which overlapping has consequently occurred, or deforming said blocks without changing their areas; and repeating the compression in the two directions until a target size is obtained.

2. The method according to claim 1, wherein in a case where said overlapping has occurred between the block of the hard macro cell whose shape is undeformable and the block of the soft macro cell whose shape is deformable, the block of the soft macro cell is deformed.

3. The method according to claim 2, wherein a limit is set to an amount of said deformation.

4. The method according to claim 1, wherein in a case where said overlapping has occurred between the blocks of the soft macro cells whose shapes are deformable, both of the blocks are deformed.

5. The method according to claim 4, wherein both of the blocks are deformed in accordance with a length in a direction of compression thereof.

6. The method according to claim 4, wherein both of the blocks are deformed in accordance with a ratio of their areas.

7. An apparatus for placing blocks in a semiconductor integrated circuit for determining the placement of a plurality of blocks having different sizes, said apparatus comprising:

input means for inputting necessary information;

a layout specification storage unit for storing a layout specification necessary for determining the placement of the blocks;

a central processing unit for executing processing which includes: setting an externally contacting frame for the plurality of blocks initially placed in such a manner as to eliminate overlapping between the blocks; moving the blocks by compressing the externally contacting frame of the plurality of blocks by a predetermined length in a first direction, and moving the blocks in which overlapping has consequently occurred, or deforming said blocks without changing their areas; moving the blocks by compressing the externally contacting frame by a predetermined length in a second direction perpendicular to the first direction, and moving the blocks in which overlapping has consequently occurred, or deforming said blocks without changing their areas; and repeating the compression in the two directions until a target size is obtained; wherein when said overlapping has occurred at a plurality of portions, a total amount of overlapping is distributed to the overlapping portions in accordance with a ratio of sums of areas of respective two overlapping blocks, and each corresponding block is deformed by using the distributed amount of overlapping as a compression length;

a layout information storage unit for storing layout information being processed by said central processing unit;

a display for displaying a state of processing by said central processing unit; and output means for outputting information determined by said central processing unit.

8. An apparatus for placing blocks in a semiconductor integrated circuit for determining the placement of a plurality of blocks having different sizes, said apparatus comprising:

input means for inputting necessary information;

a layout specification storage unit for storing a layout specification necessary for determining the placement of the blocks;

a central processing unit for executing processing which includes: setting an externally contacting frame for the plurality of blocks initially placed in such a manner as to eliminate overlapping between the blocks; moving the blocks by compressing the externally contacting frame of the plurality of blocks by a predetermined length in a first direction, and moving the blocks in which overlapping has consequently occurred, or deforming said blocks without changing their areas; moving the blocks by compressing the externally contacting frame by a predetermined length in a second direction perpendicular to the first direction, and moving the blocks in which overlapping has consequently occurred, or deforming said blocks without changing their areas; and repeating the compression in the two directions until a target size is obtained; wherein when said overlapping has occurred at plurality of portions, a total amount of overlapping is distributed to the overlapping portions in accordance with a ratio of sums of side lengths of respective two overlapping blocks, and each corresponding block is deformed by using the distributed amount of overlapping as a compression length;

a layout information storage unit for storing layout information being processed by said central processing unit;

a display for displaying a state of processing by said central processing unit; and output means for outputting information determined by said central processing unit.

9. The method of placing blocks in a semiconductor integrated circuit for determining the placement of a plurality of blocks having different sizes, comprising the steps of:

setting an externally contacting frame for the plurality of blocks initially placed in such a manner as to eliminate overlapping between the blocks;

moving the blocks by compressing the externally contacting frame of the plurality of blocks by a predetermined length in a first direction, and moving the blocks in which overlapping has consequently occurred, or deforming said blocks without changing their areas;

moving the blocks by compressing the externally contacting frame by a predetermined length in a second direction perpendicular to the first direction, and moving the blocks in which overlapping has consequently occurred, or deforming said blocks without changing their areas; and repeating the compression in the two directions until a target size is obtained, wherein where said overlapping has occurred at a plurality of portions, a total amount of overlapping is distributed to the overlapping portions in accordance with a ratio of respective amounts of overlapping, and each corresponding block is deformed by using the distributed amount of overlapping as a compression length.

10. The method of placing blocks in a semiconductor integrated circuit for determining the placement of a plurality of blocks having different sizes, comprising the steps of:

setting an externally contacting frame for the plurality of blocks initially placed in such a manner as to eliminate overlapping between the blocks;

moving the blocks by compressing the externally contacting frame of the plurality of blocks by a predetermined length in a first direction, and moving the blocks in which overlapping has consequently occurred, or deforming said blocks without changing their areas;

moving the blocks by compressing the externally contacting frame by a predetermined length in a second direction perpendicular to the first direction, and moving the blocks in which overlapping has consequently occurred, or deforming said blocks without changing their areas; and repeating the compression in the two directions until a target size is obtained, wherein where said overlapping has occurred at a plurality of portions, a total amount of overlapping is distributed to the overlapping portions in accordance with a ratio of sums of areas of respective two overlapping blocks, and each corresponding block is deformed by using the distributed amount of overlapping as a compression length.

11. The method of placing blocks in a semiconductor integrated circuit for determining the placement of a plurality of blocks having different sizes, comprising the steps of:

setting an externally contacting frame for the plurality of blocks initially placed in such a manner as to eliminate overlapping between the blocks;

moving the blocks by compressing the externally contacting frame of the plurality of blocks by a predetermined length in a first direction, and moving the blocks in which overlapping has consequently occurred, or deforming said blocks without changing their areas;

moving the blocks by compressing the externally contacting frame by a predetermined length in a second direction perpendicular to the first direction, and moving the blocks in which overlapping has consequently occurred, or deforming said blocks without changing their areas; and repeating the compression in the two directions until a target size is obtained, wherein where said overlapping has occurred at a plurality of portions, a total amount of overlapping is distributed to the overlapping portions in accordance with a ratio of sums of side lengths of respective two overlapping blocks, and each corresponding block is deformed by using the distributed amount of overlapping as a compression length.

12. An apparatus for placing blocks in a semiconductor integrated circuit for determining the placement of a plurality of blocks having different sizes, said apparatus comprising:

input means for inputting necessary information;

a layout specification storage unit for storing a layout specification necessary for determining the placement of the blocks;

a central processing unit for executing processing which includes: setting an externally contacting frame for the plurality of blocks initially placed in such a manner as to eliminate overlapping between the blocks; moving the blocks by compressing the externally contacting frame of the plurality of blocks by a predetermined length in a first direction, and moving the blocks in which overlapping has consequently occurred, or deforming said blocks without changing their areas; moving the blocks by compressing the externally contacting frame by a predetermined length in a second direction perpendicular to the first direction, and moving the blocks in which overlapping has consequently occurred, or deforming said blocks without changing their areas; and repeating the compression in the two directions until a target size is obtained; wherein when said overlapping has occurred at a plurality of portions, a total amount of overlapping is distributed to the overlapping portions in accordance with a ratio of respective amounts of overlapping, and each corresponding block is deformed by using the distributed amount of overlapping as a compression length;

a layout information storage unit for storing layout information being processed by said central processing unit;

a display for displaying a state of processing by said central processing unit; and output means for outputting information determined by said central processing unit.

\* \* \* \* \*